US012796134B2

(12) United States Patent
Kuo et al.

(10) Patent No.: US 12,796,134 B2
(45) Date of Patent: Nov. 10, 2026

(54) IMAGE SENSOR

(71) Applicant: VisEra Technologies Company Limited, Hsin-Chu City (TW)

(72) Inventors: Shin-Hong Kuo, Hsin-Chu City (TW); Po-Hsiang Wang, Hsin-Chu City (TW); Han-Lin Wu, Hsin-Chu City (TW); Hung-Jen Tsai, Hsin-Chu City (TW)

(73) Assignee: VisEra Technologies Company Limited, Hsin-Chu City (TW)

( * ) Notice: Subject to any disclaimer, the term of this patent is extended or adjusted under 35 U.S.C. 154(b) by 544 days.

(21) Appl. No.: 18/465,578

(22) Filed: Sep. 12, 2023

(65) Prior Publication Data

US 2025/0089389 A1 Mar. 13, 2025

(51) Int. Cl.
*H10F 39/00* (2025.01)

(52) U.S. Cl.
CPC ..... *H10F 39/8053* (2025.01); *H10F 39/8063* (2025.01)

(58) Field of Classification Search
CPC ......................... H10F 39/8053; H10F 39/8063
See application file for complete search history.

(56) References Cited

U.S. PATENT DOCUMENTS 10,338,275 B1 * 7/2019 Acosta ............... H04N 23/6812
2010/0244169 A1 * 9/2010 Maeda ................... G02B 1/118 257/E31.127
2020/0052025 A1 * 2/2020 Pan ....................... H10F 39/024
2021/0136264 A1 * 5/2021 Kim ....................... H04N 23/55
2022/0139980 A1 * 5/2022 Lin ......................... G02B 1/111 348/207.99

FOREIGN PATENT DOCUMENTS

CN 111430394 A * 7/2020 ........... H10F 39/024
CN 111432100 A 7/2020
TW 202011060 A 3/2020

OTHER PUBLICATIONS

Aspheric Optics; Turner; Damery (Year: 2011).*
Image sensor structure and manufacturing method; Ye (Year: 2020).*
Aspheric Optics; Turner; Damery (Year: 2011) (Year: 2011).*
Office Action dated Oct. 21, 2024 issued in corresponding TW Application No. 112144048, 6 pages.

* cited by examiner

*Primary Examiner* — Twyler L Haskins
*Assistant Examiner* — Surafel Yilmakassaye
(74) *Attorney, Agent, or Firm* — MUNCY, GEISSLER, OLDS & LOWE, P.C.

(57) ABSTRACT

An image sensor includes a sensor layer and a color filter layer disposed on the sensor layer. The image sensor further includes a lens layer disposed on the color filter layer. The lens layer includes a plurality of micro lenses. The image sensor further includes a first cut filter layer disposed over the lens layer. The first surface of the first cut filter layer has a plurality of first protrusions.

17 Claims, 20 Drawing Sheets

IMAGE SENSOR

BACKGROUND OF THE INVENTION

Field of the Invention

The present disclosure relates to an image sensor, and in particular to an image sensor with a cut filter layer.

Description of the Related Art

Image sensors, such as complementary metal oxide semiconductor (CMOS) image sensors (also known as CIS), are widely used in various image-capturing apparatuses such as digital still-image cameras, digital video cameras, and the like. The light-sensing portion of the image sensor may detect ambient color change, and signal electric charges may be generated depending on the amount of light received in the light-sensing portion. In addition, the signal electric charges generated in the light-sensing portion may be transmitted and amplified, whereby an image signal is obtained.

Based on industrial demand, pixel size has continuously been reduced. In order to maintain high levels of performance, a group of Phase Difference Auto Focus (PDAF) pixels can be integrated with conventional pixels. Light received by the group of PDAF pixels may converge through the color filter, to be collected at the sensing portion at the bottom, and the image focus for the apparatus is detected. An image sensor with a minimized pixel size may experience a slight offset in precision, which can significantly affect the overall performance of the device. Therefore, these and related issues need to be addressed through the design and manufacture of the image sensor.

In general, a conventional cut filter layer has a flat top surface, so that the total reflection of the cut filter layer may reflect flare rays into the image sensor. Therefore, in order to maintain the level of the product's performance, the industry still needs to improve the cut filter layer to achieve the desired goal of maintaining the yield of the image sensor.

BRIEF SUMMARY OF THE INVENTION

An embodiment of the present disclosure provides an image sensor that includes a sensor layer and a color filter layer disposed on the sensor layer. The image sensor further includes a lens layer disposed on the color filter layer. The lens layer includes a plurality of micro lenses. The image sensor further includes a first cut filter layer disposed over the lens layer. The first surface of the first cut filter layer has a plurality of first protrusions.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION OF THE INVENTION

Figure 1:
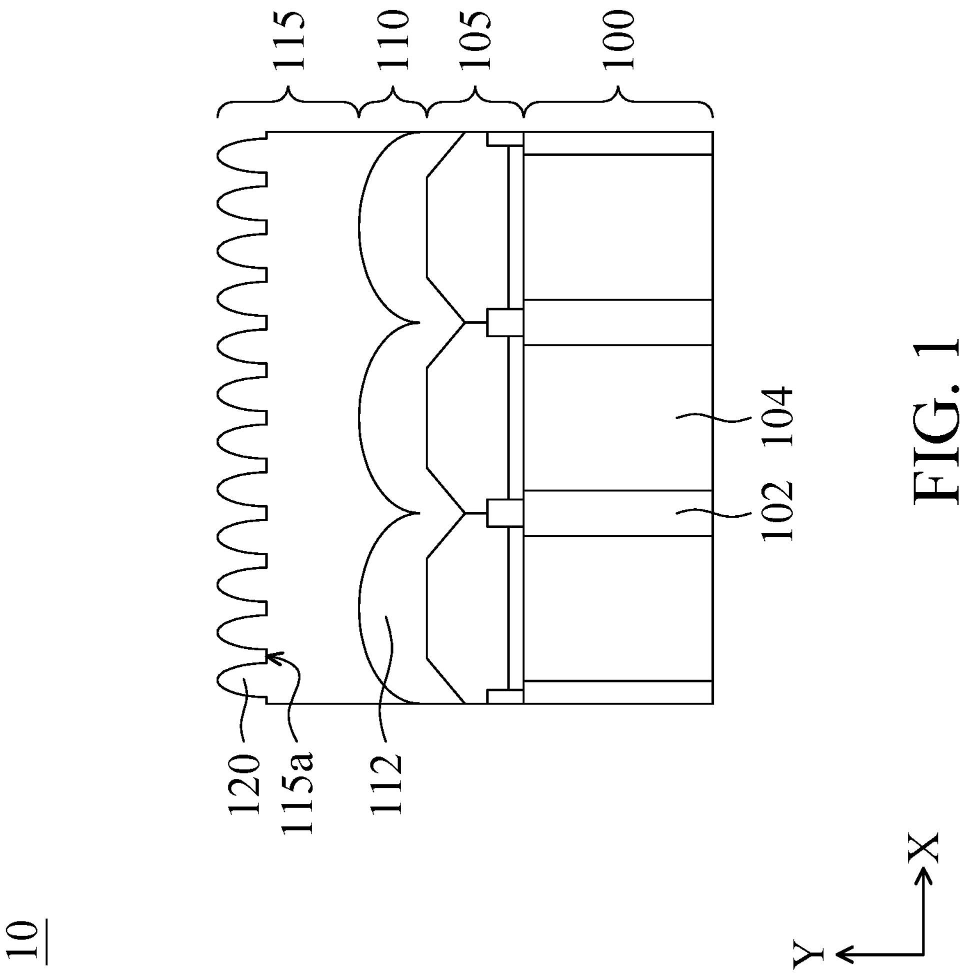
FIG. 1 illustrates a cross-sectional view of the image sensor according to some embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during the manufacturing process, as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art.

Unless otherwise defined, all terms (including technical and scientific terms) used herein have the same meaning as commonly understood by one of ordinary skill in the art to which this disclosure belongs. It should be understood that terms such as those defined in commonly used dictionaries should be interpreted as having a meaning that is consistent with their meaning in the context of the prior art and will not be interpreted in an idealized or overly formal sense unless expressly so defined in the embodiments of the present disclosure.

The present disclosure may repeat reference numerals and/or letters in following embodiments. This repetition is for the purpose of simplicity and clarity and does not in itself dictate a relationship between the various embodiments and/or configurations discussed.

In conventional configurations, an additional cut filter layer, such as UV-cut filter or IR-cut filter, is generally applied on the image sensor. The cut filter layer is able to block light of a specific wavelength and allow light of the selected wavelength to pass through, such as allowing visible wavelength to pass through. However, the existing configuration of the cut filter layer is to incorporate a cut filter layer with a flat top surface on the image sensor. Since the blocking ability (or reflection ability) of the cut filter has its limitations, and the flat cut filter layer may cause the light to reflect repeatedly between it and the image sensor and generate flare rays into the image sensor, there is still a need to improve the design and configuration of the cut filter layer. By providing a cut filter layer with a plurality of protrusions, the embodiment of the present disclosure may effectively improve the problem of flare rays and enhance the capability of selection of the cut filter layer. In other words, the cut filter layer of the present embodiment may block (or reflect) the light of the specific wavelength more effectively and reduce the percentage of light of the selected wavelength to be blocked (or reflected), which effectively improves the performance of the image sensor.

FIG. 1 illustrates a cross-sectional view of an image sensor 10 according to some embodiments of the present disclosure. In some embodiments, the image sensor 10 includes a sensor layer 100, a color filter layer 105, and a lens layer 110. In some embodiments, the sensor layer 100 includes a light-shielding layer 102 and a sensor component 104. In some embodiments, the sensor layer 100 may form on a substrate (not shown). In some embodiments, the substrate may be an elemental semiconductor including silicon or germanium; a compound semiconductor including gallium nitride (GaN), silicon carbide (SiC), gallium arsenide (GaAs), gallium phosphide (GaP), indium phosphide (InP), indium arsenide (InAs), and/or indium antimonide (InSb); an alloy semiconductor including silicon germanium (SiGe) alloy, gallium arsenide phosphide (GaAsP) alloy, aluminum indium arsenide (AlInAs) alloy, aluminum gallium arsenide (AlGaAs) alloy, gallium indium arsenide (GaInAs) alloy, gallium indium phosphide (GaInP) alloy, and/or gallium indium arsenide phosphide (GaInAsP) alloy; or a combination thereof. In some embodiments, the substrate may be a photoelectric conversion substrate, for example, silicon substrate or organic photoelectric conversion layer. In other embodiments, the substrate may also be a semiconductor on insulator (SOI) substrate. The semiconductor on insulator substrate may include a base plate, a buried oxide layer disposed on the base plate, and a semiconductor layer disposed on the buried oxide layer. Furthermore, the substrate may be an N-type or a P-type conductive type.

The light-shielding layer 102 may define the region of the sensor component 104. The sensor component 104 may include sensing unit, such as photodiodes, which may convert received light signals into electric signals. In some embodiments, the light-shielding layer 102 may have a lower refractive index than the sensor component 104. The refractive index is a characteristic of a substance that changes the speed of light, and is a value obtained by dividing the speed of light in vacuum by the speed of light in the substance. When light travels between two different materials at an angle, its refractive index determines the angle of light transmission (refraction). When incident light enters the sensor layer 100, the light-shielding layer 102 may isolate light rays within the specific unit to serve as the light-trapping function. In some embodiments, the material of the light-shielding layer 102 may include a transparent dielectric material.

Referring to FIG. 1, the color filter layer 105 is disposed on the sensor layer 100. In some embodiments, the height of the color filter layer 105 may be between approximately 0.3 μm and 2.0 μm. In a particular embodiment, the height of the color filter layer 105 may be approximately 0.9 μm. In some embodiments, the color filter layer 105 may include multiple units, which may be colored red, green, blue, white, or infrared. In some embodiments, the color filter layer 105 may be formed in sequence by a coating, exposure, and development process at different steps. Alternatively, the color filter layer 105 may be formed by ink-jet printing.

Continue referring to FIG. 1, the lens layer 110 disposed on the color filter layer 105. The lens layer 110 includes a plurality of micro lenses 112. The micro lenses 112 may enable light to converge together for tracking and detecting. In some embodiments, the lens layer 110 serves to converge incident light into the sensor layer 100 through the color filter layer 105. In some embodiments, the material of the lens layer 110 may be a transparent material. For example, the material may include glass, epoxy resin, silicone resin, polyurethane, any other applicable material, or a combination thereof, but the present disclosure is not limited thereto. In some embodiments, the lens layer 110 may be formed by a photoresist reflow method, a hot embossing method, any other applicable method, or a combination thereof. In some embodiments, the steps of forming the lens layer 110 may include a spin-on coating process, a lithography process, an etching process, any other applicable processes, or a combination thereof, but the present disclosure is not limited thereto.

Still referring to FIG. 1, the image sensor 10 further includes a first cut filter layer 115 disposed over the lens layer 110. In some embodiments, a first surface **115*a* of the first cut filter layer 115 has a plurality of first protrusions 120. As mentioned above, the flat cut filter may cause the light to reflect repeatedly between it and the image sensor and generate flare rays into the image sensor. Therefore, the embodiments of the present disclosure provide a cut filter layer with a plurality of protrusions. The protrusions have the characteristic of graded index of refraction in the spatial material density, which improves the transmittance on selected wavelength and the reflectivity on undesired wavelength. In some embodiments, the refractive index of the lens layer 110 is greater than the refractive index of the first cut filter layer 115. In some embodiments, the material of the first protrusions 120 of the first cut filter layer 115 includes $ZrO_2$, $TiO_2$, $Si_3N_4$, $SiO_2$, indium tin oxide (ITO), Si, amorphous silicon, polycrystalline silicon, group III-V semiconductor compounds, or a combination thereof. In some embodiments, the material of the first protrusions 120 includes photoresist, acrylic, plastic, glass, glue, polydimethylsiloxane (PDMS), light-curing materials, heat-curing materials, or a combination thereof. In some embodiments, the first protrusions 120 are formed by a nanoimprinting process, a photolithography process, a material reflow process, a molding process, a laser engraving process, an electron beam engraving process, or a combination thereof. In some embodiments, the first protrusions 120** are formed by light-curing, heat-curing, stress curing, electric curing, or a combination thereof.

Figure 2:
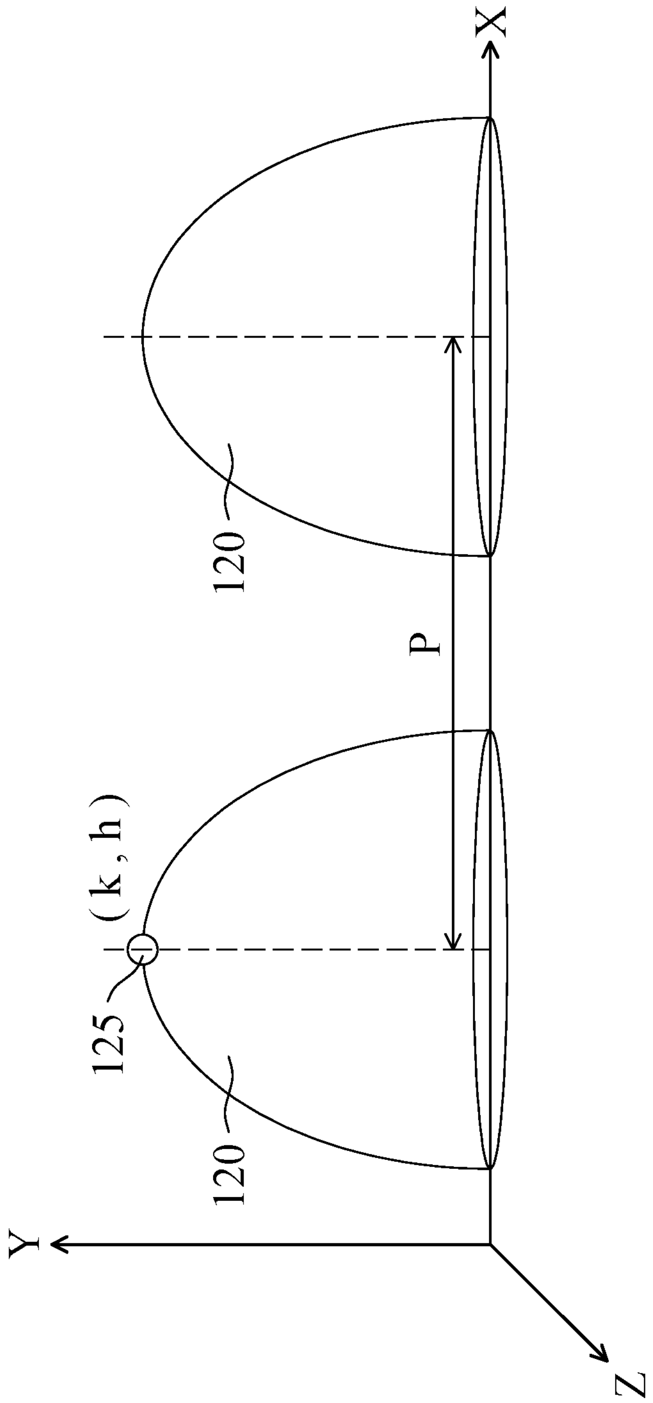
FIGS. 2, 3, and 4 illustrate perspective views of the protrusions according to some embodiments of the present disclosure.

Referring to FIG. 2, FIG. 2 illustrates a perspective view of the first protrusions 120 according to some embodiments of the present disclosure. In some embodiments, each of the first protrusions 120 in a cross-section of the first direction X and the second direction Y satisfies the following equation (1):

$$(x-k)^2 = q(y-200r) \tag{1}$$

Where x is the coordinate of each of the first protrusions 120 in the first direction X, y is the coordinate of each of the first protrusions 120 in the second direction Y, k is the coordinate of a tipping point 125 of each of the first protrusions 120 in the first direction X, q is a constant less than 0, r is a constant greater than 1, and the first direction X is perpendicular to the second direction Y. In some embodiments, the greater the q, the greater the opening at the bottom surface of the first protrusion 120 in the cross-section. In some embodiments, the height h of each of the first protrusions 120 satisfies the equation h=200 r. That is, the greater the r, the greater the h. In some embodiments, the first protrusions 120 are a periodic structure, in other words, the entire structure has the same period and structural appearance. In some embodiments, the pitch P of two adjacent first protrusions 120 is less than about 700 nm. Pitch P represents the distance between any two adjacent protrusions.

Figure 3:
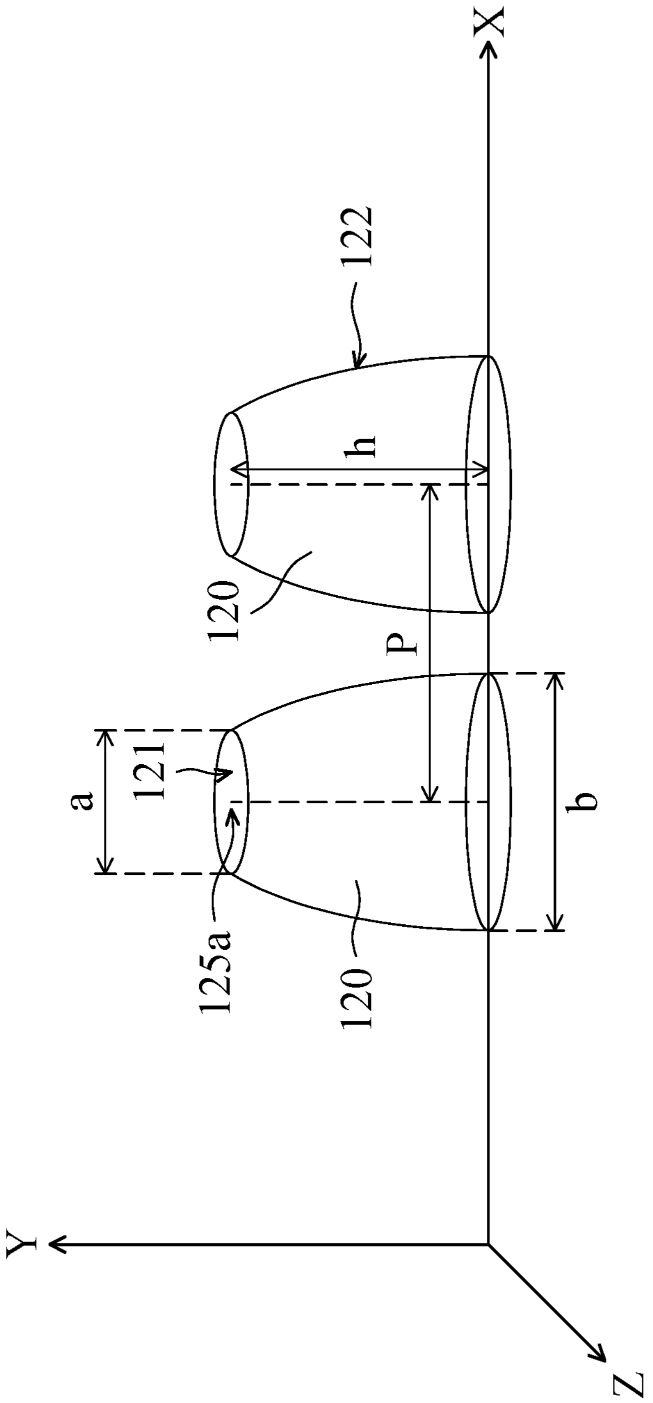

Referring to FIG. 3, FIG. 3 illustrates a perspective view of the first protrusions 120 according to other embodiments of the present disclosure. In some embodiments, each of the first protrusions 120 has a flat upper surface 121, and the diameter a of the flat upper surface 121 is less than the diameter b of the bottom surface of each of the first protrusions 120. In some embodiments, the curved surface 122 connecting the flat upper surface 121 and the bottom surface of each of the first protrusions 120 in the cross-section of the first direction X and the second direction Y satisfies the following equation (2):

$$y = q(x-k)^2 + h \tag{2}$$

Where x is the coordinate of each of the first protrusions 120 in the first direction X, y is the coordinate of each of the first protrusions 120 in the second direction Y, k is the coordinate of a top point 125*a* of each of the first protrusions 120 in the first direction X, q is a constant less than 0, h is a vertical distance between the flat upper surface 121 and the bottom surface of each of the first protrusions 120, and the first direction X is perpendicular to the second direction Y.

Figure 4:
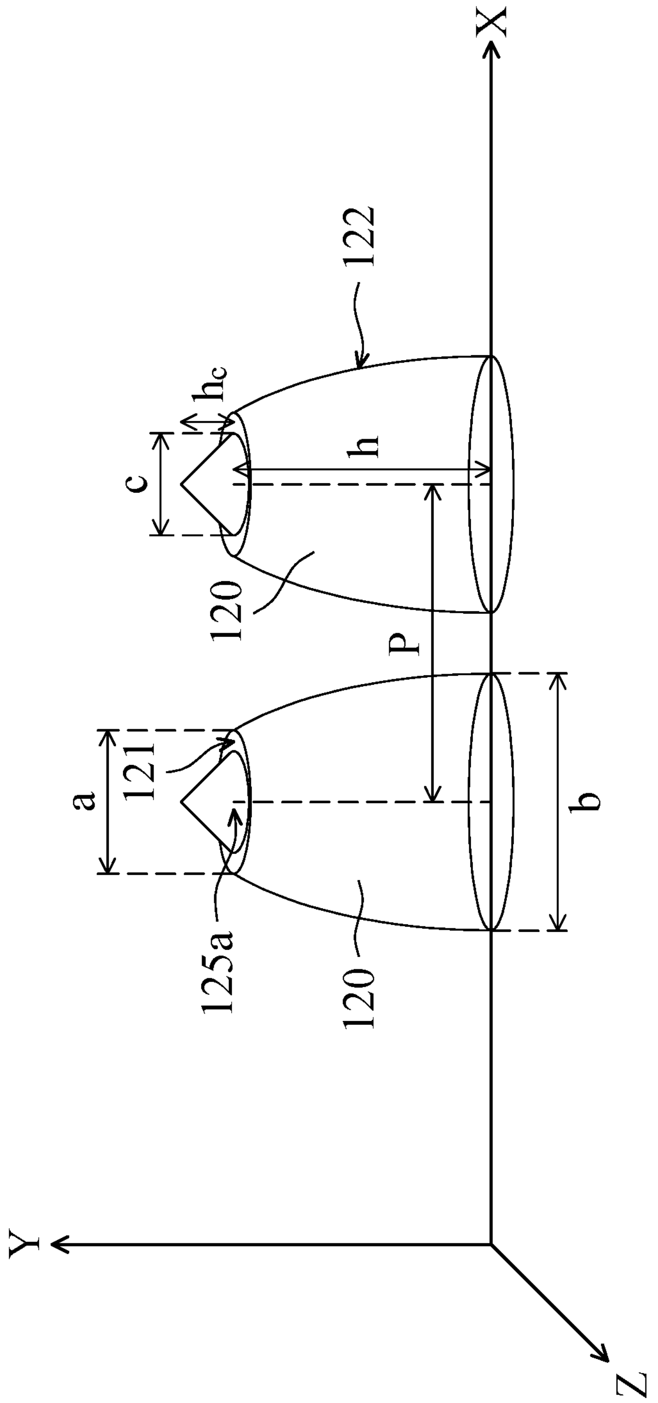

Referring to FIG. 4, FIG. 4 illustrates a perspective view of the first protrusions 120 according to other embodiments of the present disclosure. In some embodiments, each of the first protrusions 120 has a flat upper surface 121, and the diameter a of the flat upper surface 121 is less than the diameter b of the bottom surface of each of the first protrusions 120. In addition, in some embodiments, each of the first protrusions 120 has a sub-protrusion 128 on the flat upper surface 121. In some embodiments, the sub-protrusion 128 on the flat upper surface 121 is a conical structure. In some embodiments, a curved surface 122 connecting the flat upper surface 121 and the bottom surface of each of the first protrusions 120 in the cross-section of the first direction X and the second direction Y satisfies the following equation (2):

$$y = q(x-k)^2 + h \tag{2}$$

Where x is the coordinate of each of the first protrusions 120 in the first direction X, y is the coordinate of each of the first protrusions 120 in the second direction Y, k is the coordinate of the top point 125*a* of the flat upper surface 121 of each of the first protrusions 120 in the first direction X, q is a constant less than 0, h is a vertical distance between the flat upper surface 121 and the bottom surface of each of the first protrusions 120, and the first direction X is perpendicular to the second direction Y. In some embodiments, the diameter c of the bottom surface of the sub-protrusion 128 on the flat upper surface 121 satisfies $c \leq a < b$. In some embodiments, the height $h_c$ of the sub-protrusion 128 satisfies $h > h_c$.

Figure 5:
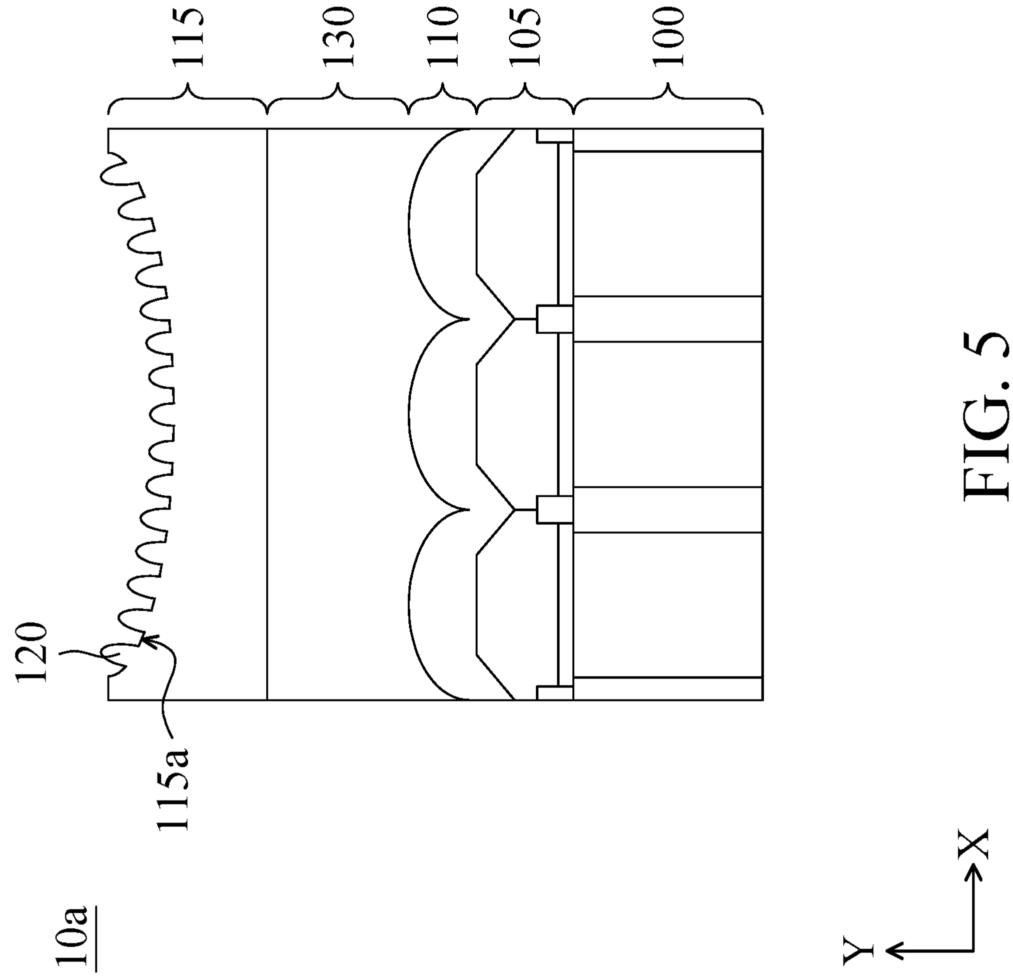
FIGS. 5, 6, 7, 8A, 8B, 8C, 9, 10, 11, 12, and 13 illustrate cross-sectional views of the image sensor according to some embodiments of the present disclosure.

FIG. 5 illustrates a cross-sectional view of the image sensor 10*a* according to some embodiments of the present disclosure. In some embodiments, the first surface 115*a* of the first cut filter layer 115 is a concave surface. In addition, in some embodiments, the image sensor 10*a* further includes a second cut filter layer 130 disposed between the first cut filter layer 115 and the lens layer 110, i.e., the second cut filter layer 130 disposed on the lens layer 110 and the first cut filter layer 115 disposed on the second cut filter layer 130. Using the second cut filter layer 130 with a lower refractive index allows the lens layer 110 to have a higher optical power. In some embodiments, the refractive index of the lens layer 110 is greater than the refractive index of the second cut filter layer 130. In some embodiments, the refractive index of the first cut filter layer 115 is greater than the refractive index of the second cut filter layer 130.

Figure 6:
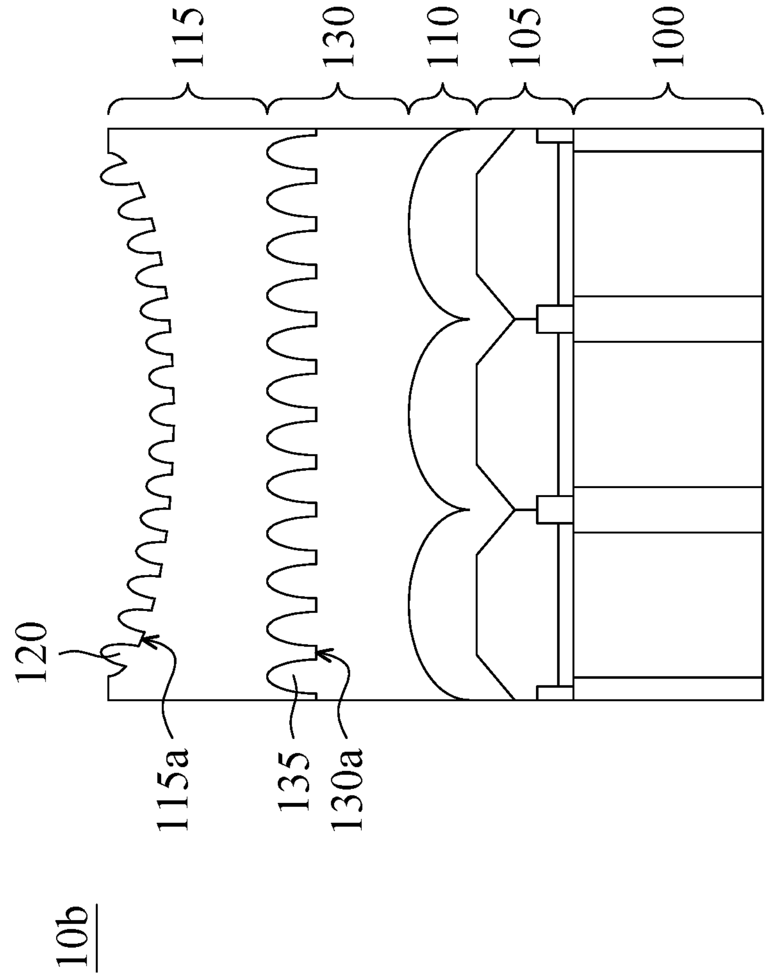

FIG. 6 illustrates a cross-sectional view of the image sensor 10*b* according to other embodiments of the present disclosure. FIG. 6 is similar to FIG. 5, except for the second cut filter layer 130 with a plurality of protrusions. In some embodiments, the first surface 115*a* of the first cut filter layer 115 is a concave surface. In some embodiments, the image sensor 10*b* further includes a second cut filter layer 130 disposed between the first cut filter layer 115 and the lens layer 110. In some embodiments, the upper surface 130*a* of the second cut filter layer 130 has a plurality of second protrusions 135. Using the second cut filter layer 130 with the second protrusions 135 and a lower refractive index allows the lens layer 110 to have a higher transparency and a higher optical power. In some embodiments, the refractive index of the lens layer 110 is greater than the refractive index of the second cut filter layer 130. In some embodiments, the refractive index of the first cut filter layer 115 is greater than the refractive index of the second cut filter layer 130.

Figure 7:
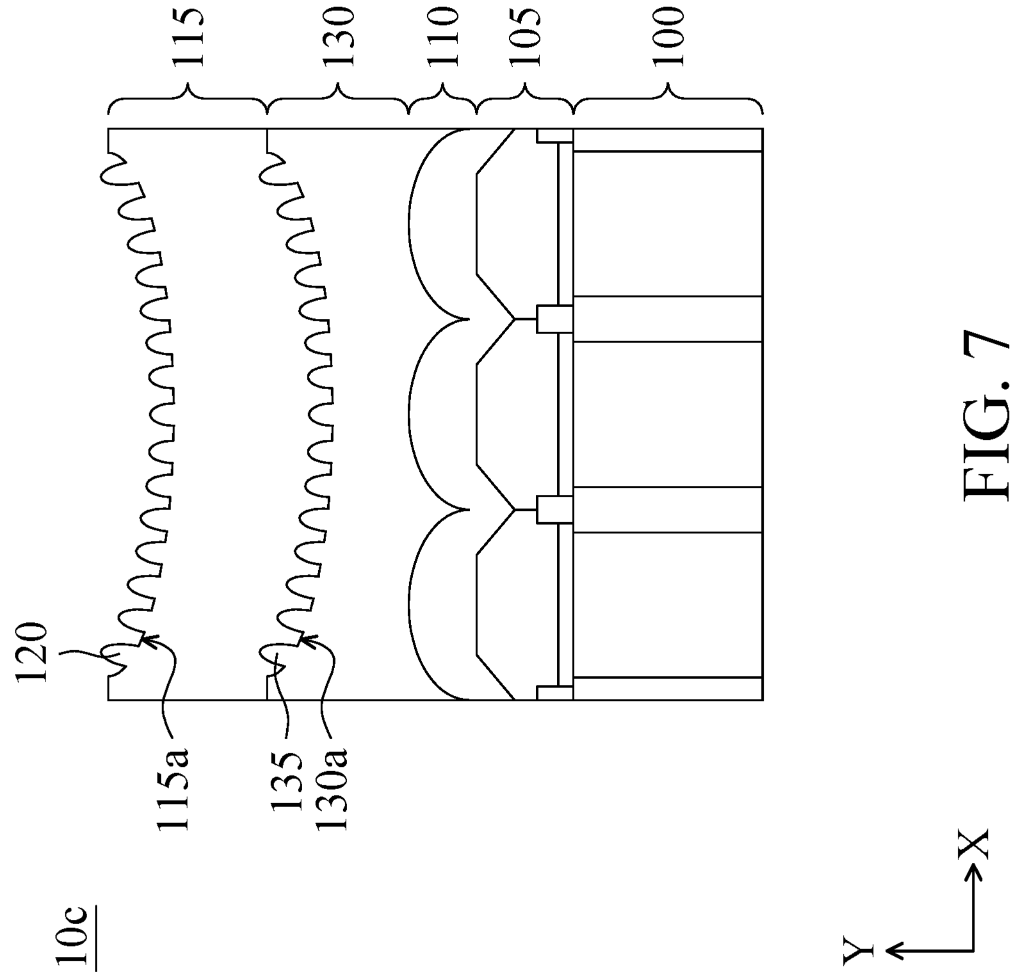

FIG. 7 illustrates a cross-sectional view of the image sensor 10*c* according to other embodiments of the present disclosure. FIG. 7 is similar to FIG. 5, except for the second cut filter layer 130 with a concave surface. In some embodiments, the first surface 115*a* of the first cut filter layer 115 is a concave surface. In some embodiments, the image sensor 10*c* further includes a second cut filter layer 130 disposed between the first cut filter layer 115 and the lens layer 110. In some embodiments, the upper surface 130*a* of the second cut filter layer 130 has a plurality of second protrusions 135. In some embodiments, the upper surface 130*a* of the second cut filter layer 130 is a concave surface.

Using the second cut filter layer 130 with the second protrusions 135 and concave surface allows the image sensor 10*c* to modify the image distortion and reduce the flare rays from the image sensor 10*c*. In some embodiments, the refractive index of the lens layer 110 is greater than the refractive index of the second cut filter layer 130. In some embodiments, the refractive index of the first cut filter layer 115 is greater than the refractive index of the second cut filter layer 130.

Figure 8A:
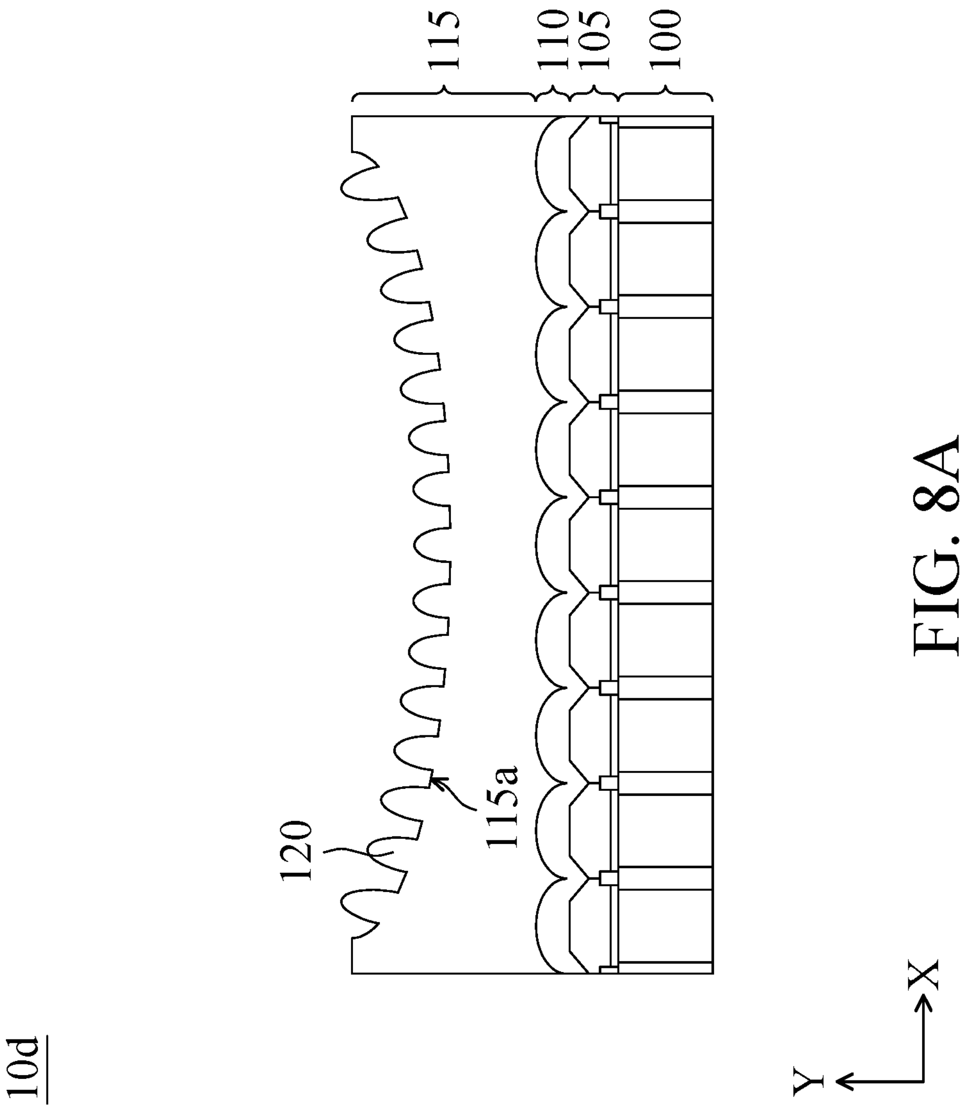
Figure 8B:
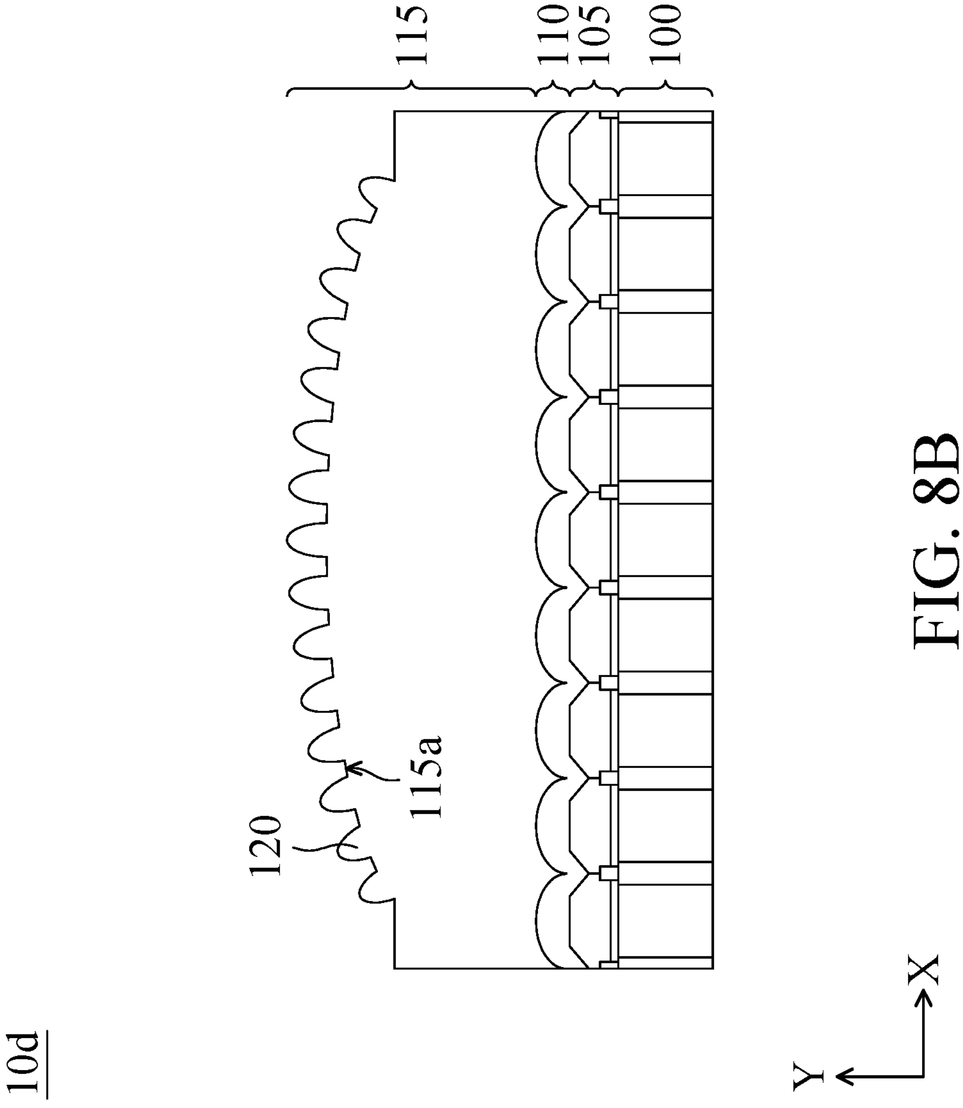
Figure 8C:
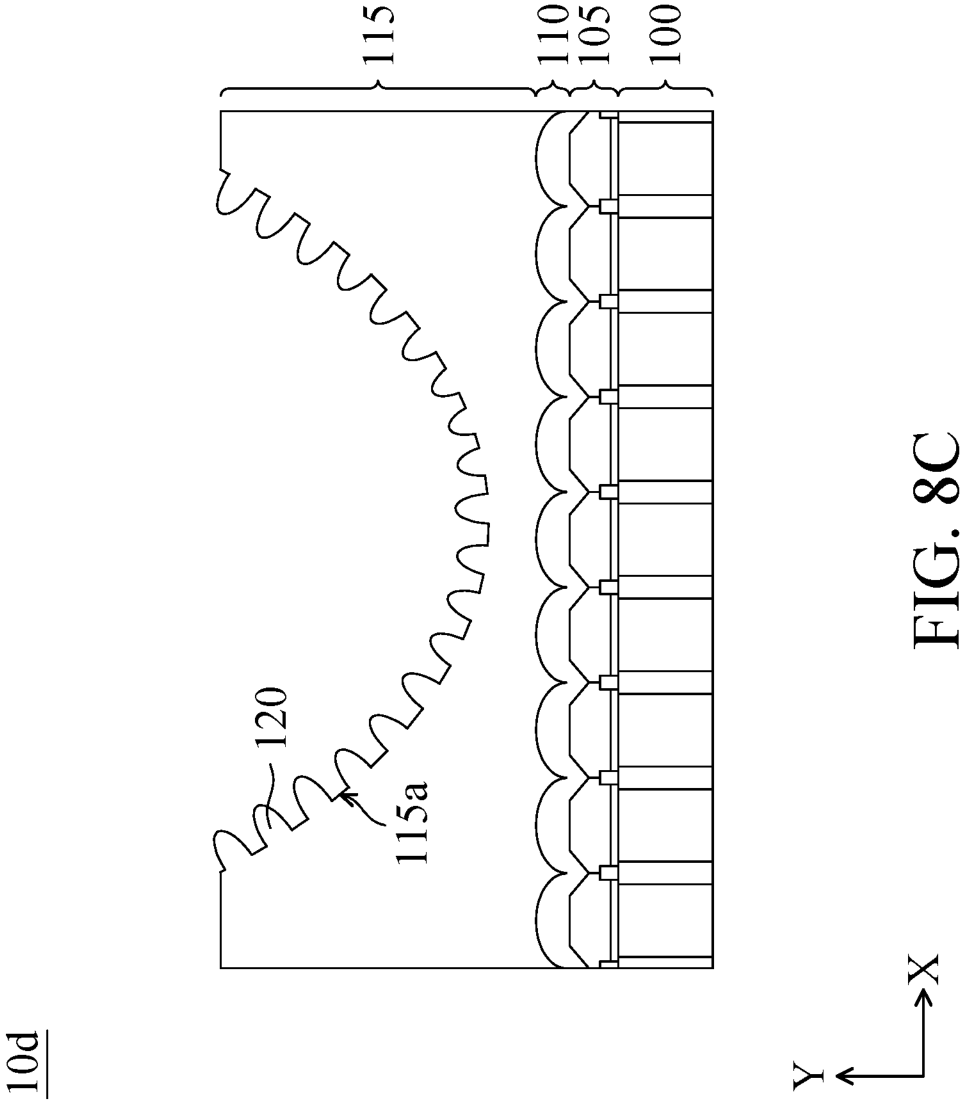

FIGS. 8A, 8B, and 8C illustrate cross-sectional views of the image sensor 10*d* according to some embodiments of the present disclosure. In some embodiments, as shown in FIG. 8A, the first surface 115*a* of the first cut filter layer 115 is a concave surface. However, in other embodiments, as shown in FIGS. 8B and 8C, the first surface 115*a* of the first cut filter layer 115 may be a convex surface or a conical surface. In some embodiments, the first surface 115*a* of the first cut filter layer 115 in the cross-section of the first direction X and the second direction Y satisfies the following equation (3):

$$x = \frac{c \cdot y^2}{1 + \sqrt{1 - (1 + k)c^2 y^2}} + a \cdot y^2 + b \cdot y^4 + d \cdot y^6 + e \cdot y^8 + f \cdot y^{10} + g \cdot y^{12} \tag{3}$$

Where x is the coordinate of each of the first protrusions 120 in the first direction X, y is the coordinate of each of the first protrusions 120 in the second direction Y, k is conical constant, c is curvature, a, b, d, e, f, g are constants, and the first direction X is perpendicular to the second direction Y. In some embodiments, the profile of concave surface is an aspheric continuous surface.

Figure 9:
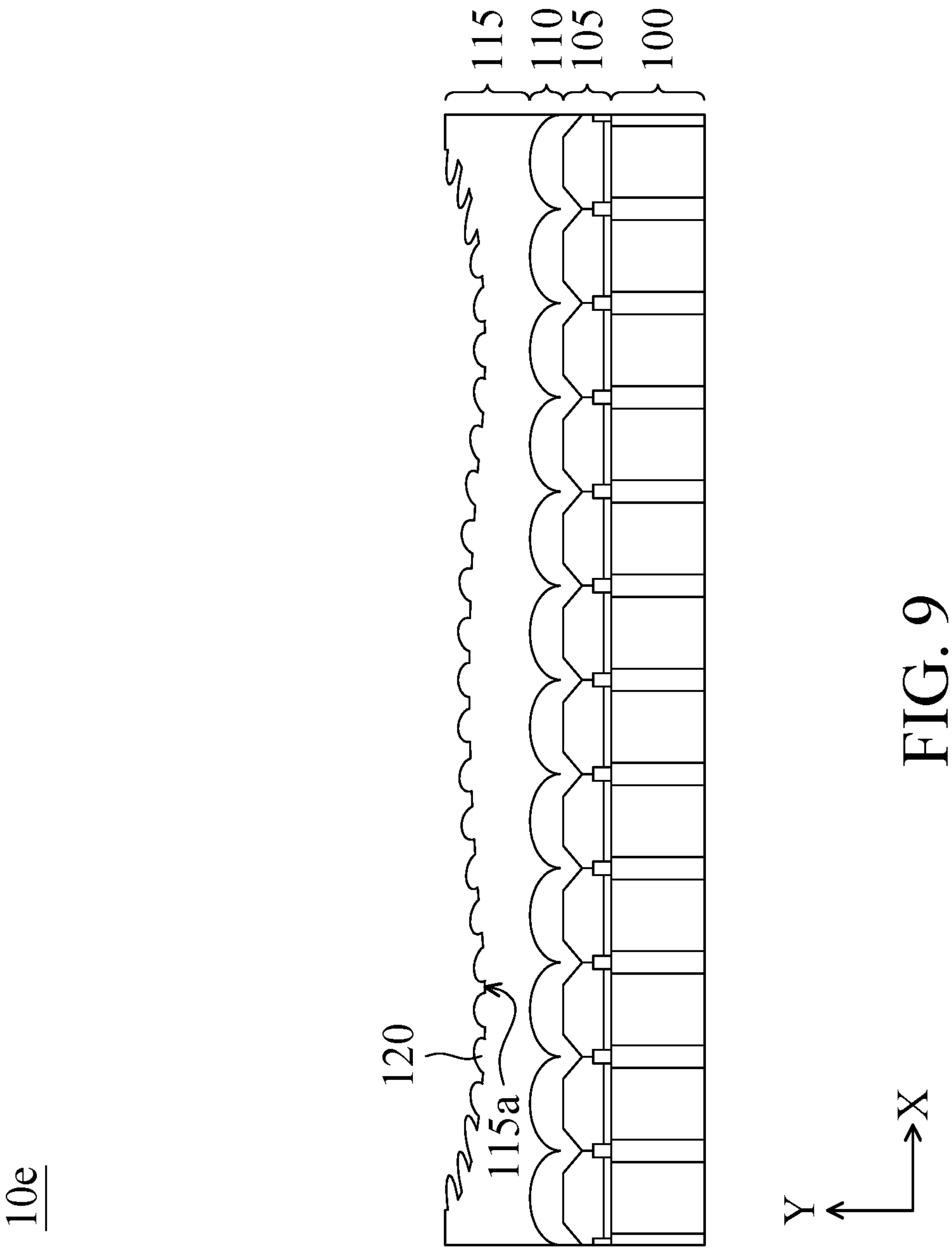

FIG. 9 illustrates a cross-sectional view of the image sensor 10*e* according to some embodiments of the present disclosure. In some embodiments, the first surface 115*a* of the first cut filter layer 115 is a free-form surface. In some embodiments, as shown in FIG. 9, the first surface 115*a* of the first cut filter layer 115 in the cross-section of the first direction X and the second direction Y also satisfies the equation (3). By using free-form surface, the image sensor 10*e* may have a better image quality.

Figure 10:
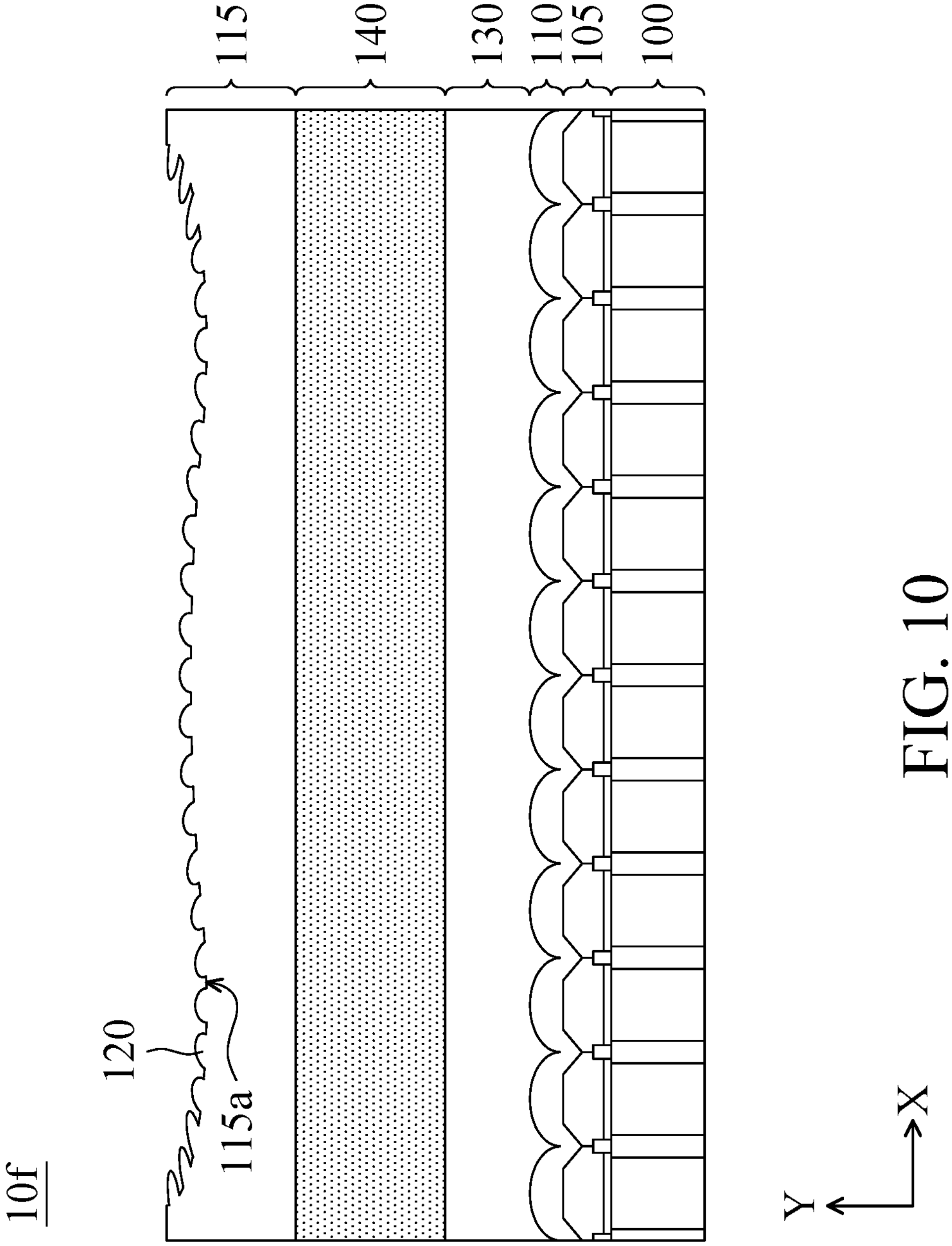

FIG. 10 illustrates a cross-sectional view of the image sensor 10*f* according to some embodiments of the present disclosure. In some embodiments, the first surface 115*a* of the first cut filter layer 115 is a free-form surface. In some embodiments, the image sensor 10*f* further includes a second cut filter layer 130 and an optical layer 140, and the second cut filter layer 130 and the optical layer 140 are disposed between the first cut filter layer 115 and the lens layer 110. In some embodiments, the second cut filter layer 130 is disposed on the lens layer 110, and the optical layer 140 is disposed on the second cut filter layer 130 and in direct contact with the first cut filter layer 115. In some embodiments, the refractive index of the lens layer 110 is greater than the refractive index of the second cut filter layer 130. In some embodiments, the second cut filter layer 130 has a flat upper surface. Using the second cut filter layer 130 with a lower refractive index allows the lens layer 110 to have a higher optical power. In some embodiments, the optical layer 140 may be a multi-film layer for passing special wavelength. In some embodiments, the optical layer 140 may be a layer with optical function, such as IR-cut filter, UV-cut filter, band pass filter, anti-flare, or a combination thereof.

Figure 11:
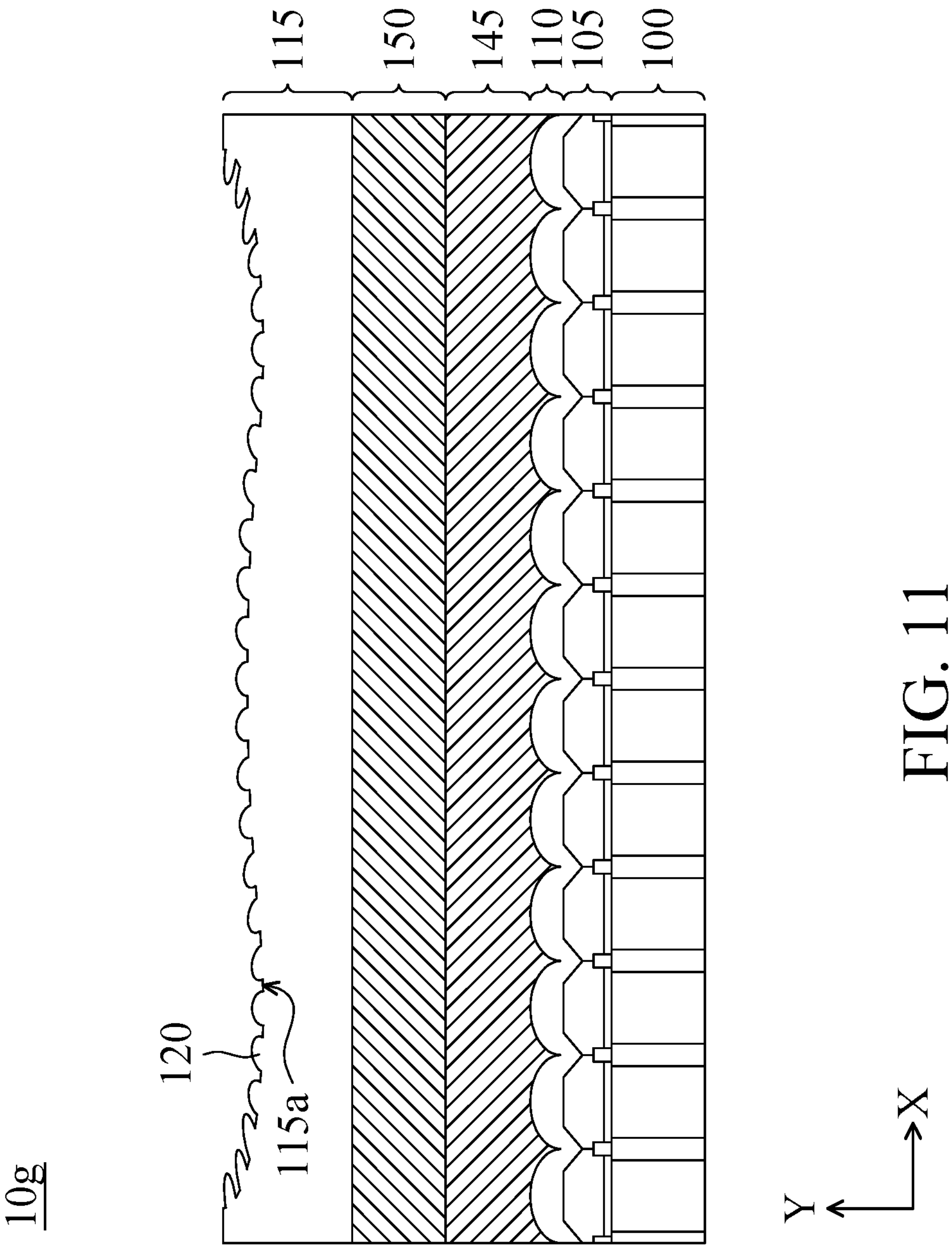

FIG. 11 illustrates a cross-sectional view of the image sensor 10*g* according to some embodiments of the present disclosure. In some embodiments, the first surface 115*a* of the first cut filter layer 115 is a free-form surface. In some embodiments, the image sensor 10*g* further includes a glue layer 145 and a substrate 150. In some embodiments, the glue layer 145 is disposed on the lens layer 110, and the substrate 150 is secured over the lens layer 110 by the glue layer 145 and in direct contact with the first cut filter layer 115. In some embodiments, the glue layer 145 and the substrate 150 are disposed between the first cut filter layer 115 and the lens layer 110. The glue layer 145 is used to attach the substrate 150 to the lens layer 110. In some embodiments, the material of the substrate 150 may be photoresist, acrylic, plastic, glass, or high transmittance materials. In some embodiments, the substrate 150 may be encapsulated on the image sensor 10*g* to increase the reliability of the image sensor 10*g*.

Figure 12:
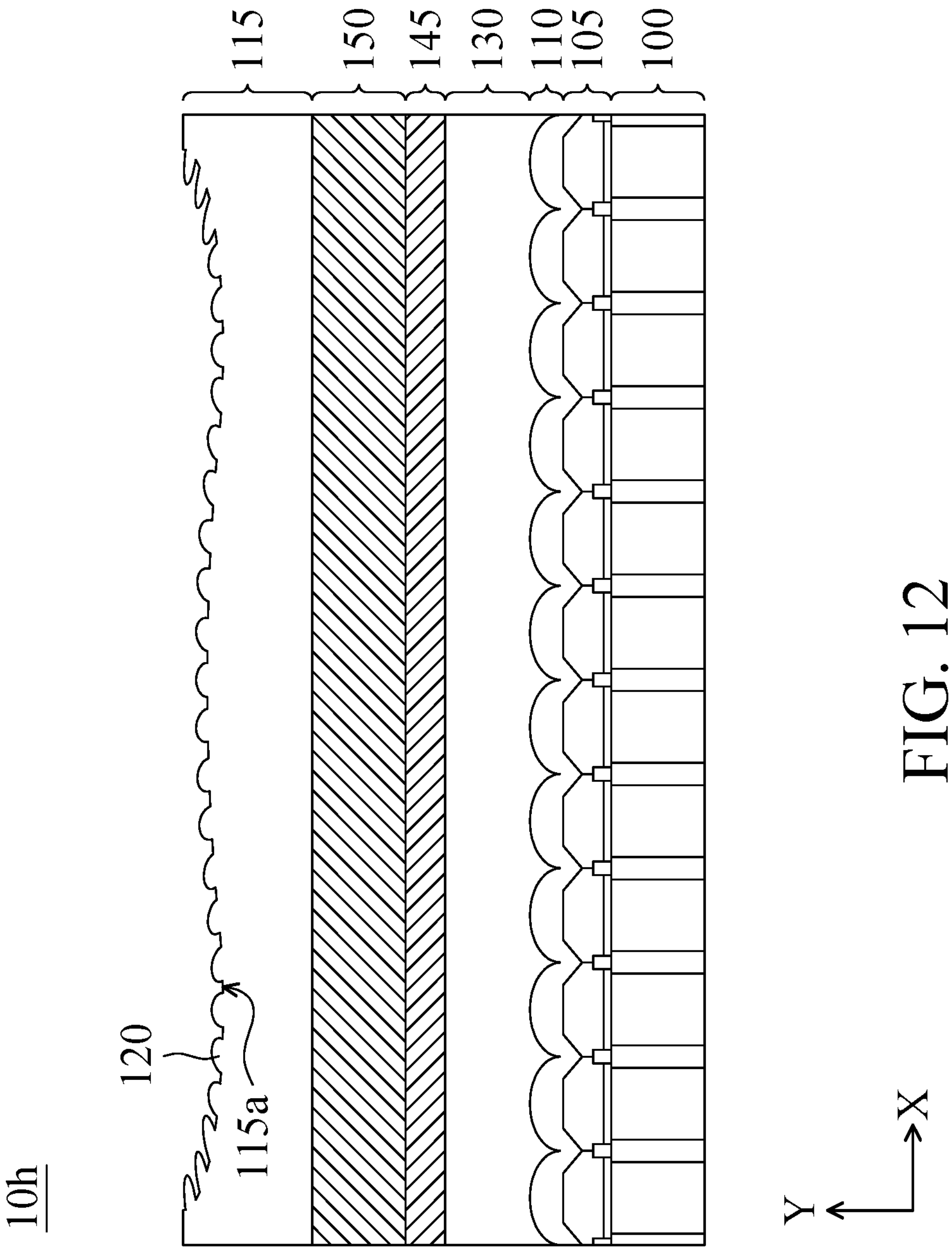

FIG. 12 illustrates a cross-sectional view of the image sensor 10*h* according to some embodiments of the present disclosure. In some embodiments, the first surface 115*a* of the first cut filter layer 115 is a free-form surface. In some embodiments, the image sensor 10*h* further includes the second cut filter layer 130, the glue layer 145, and the substrate 150. In some embodiments, the second cut filter layer 130 is disposed on the lens layer 110. In some embodiments, the refractive index of the lens layer 110 is greater than the refractive index of the second cut filter layer 130. In some embodiments, the second cut filter layer has a flat upper surface. In some embodiments, the glue layer 145 is disposed on the second cut filter layer 130. In some embodiments, the substrate 150 is secured over the second cut filter layer 130 by the glue layer 145 and in direct contact with the first cut filter layer 115. In some embodiments, the second cut filter layer 130, the glue layer 145, and the substrate 150 are disposed between the first cut filter layer 115 and the lens layer 110.

Figure 13:
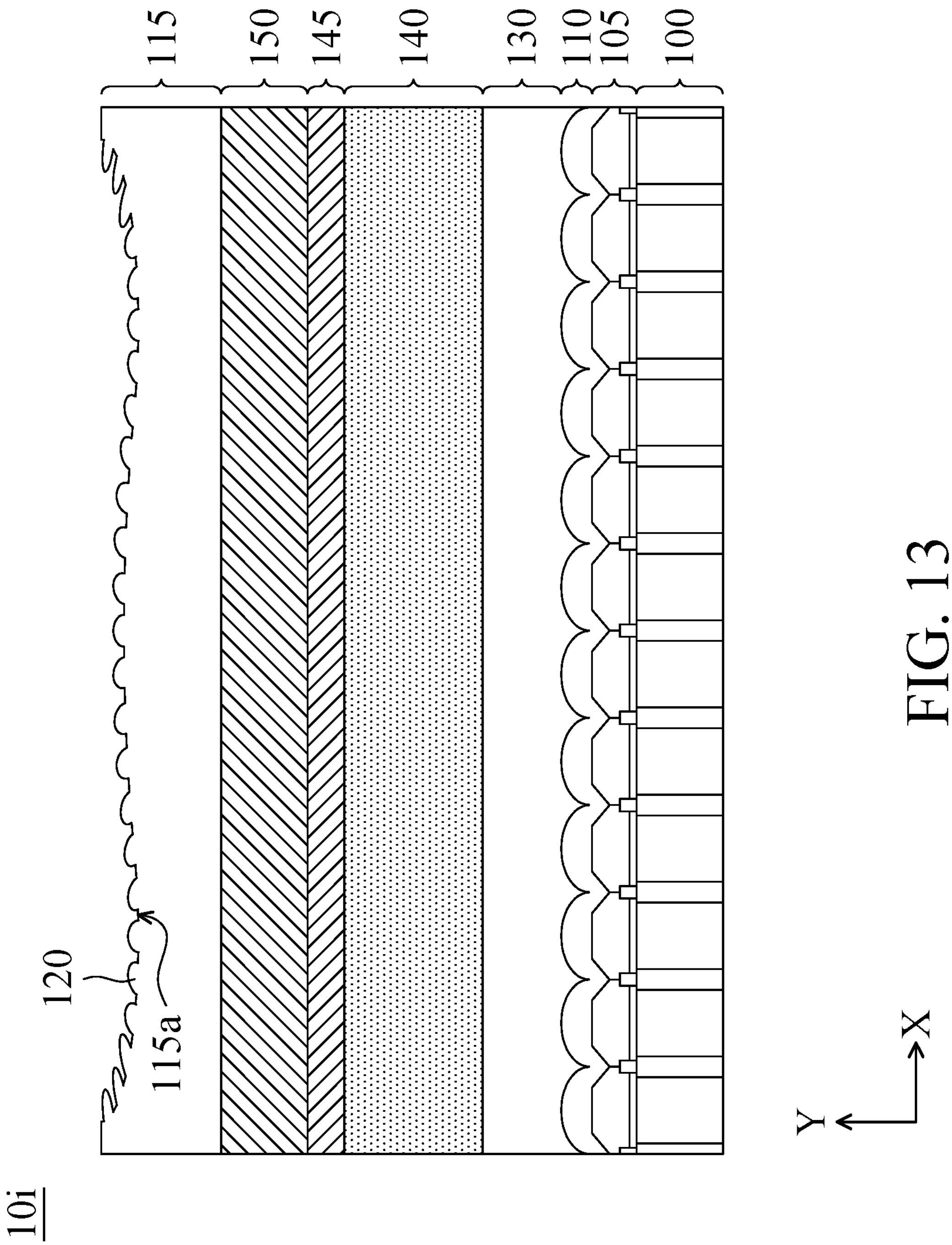

FIG. 13 illustrates a cross-sectional view of the image sensor 10*i* according to some embodiments of the present disclosure. In some embodiments, the first surface 115*a* of the first cut filter layer 115 is a free-form surface. In some embodiments, the image sensor 10*i* further includes the second cut filter layer 130, the optical layer 140, the glue layer 145, and the substrate 150. In some embodiments, the second cut filter layer 130 is disposed on the lens layer 110. In some embodiments, the refractive index of the lens layer 110 is greater than the refractive index of the second cut filter layer 130. In some embodiments, the second cut filter layer 130 has a flat upper surface. In some embodiments, the optical layer 140 is disposed on the second cut filter layer 130. In some embodiments, the glue layer 145 is disposed on the optical layer 140. In some embodiments, the substrate 150 is secured over the optical layer 140 by the glue layer 145 and in direct contact with the first cut filter layer 115. In some embodiments, the second cut filter layer 130, the optical layer 140, the glue layer 145, and the substrate 150 are disposed between the first cut filter layer 115 and the lens layer 110.

Figure 14:
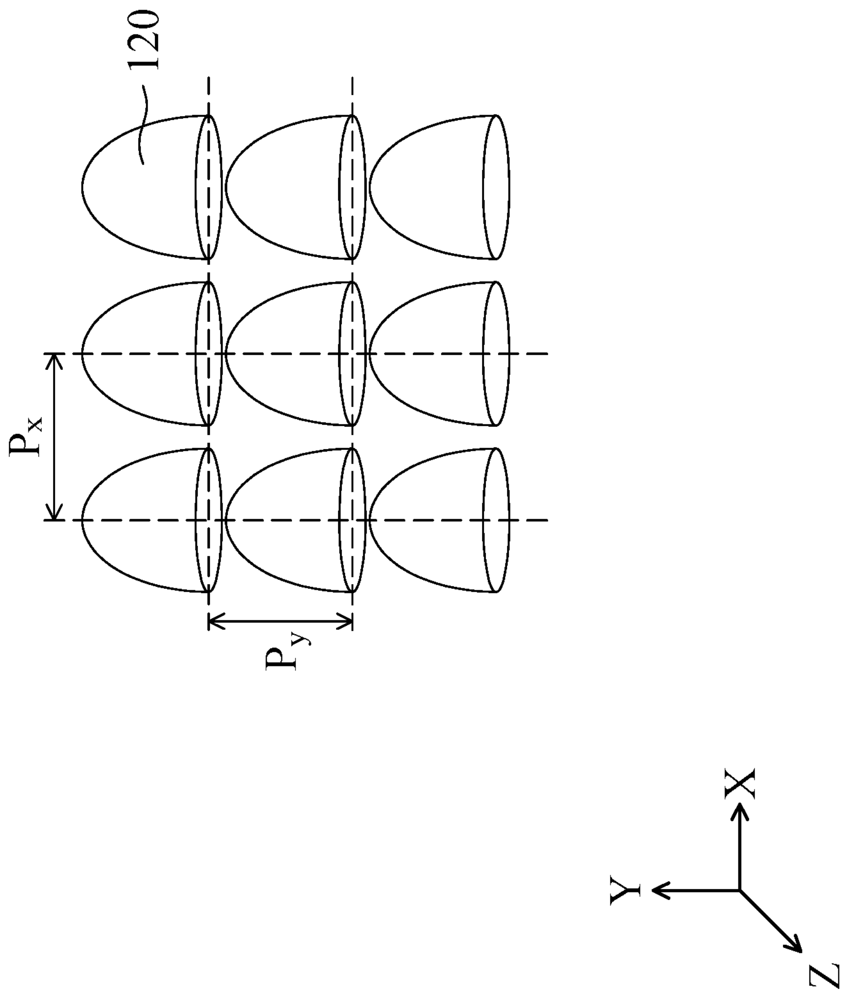
FIGS. 14, 15, 16, and 17 illustrate perspective views of the protrusions according to some embodiments of the present disclosure.

The arrangement of the first protrusions 120 may affect the quality of the optical performance, the denser the arrangement, the better the performance. The arrangement of the first protrusions 120 may be square, shifted square, regular hexagon, or fill up randomly. For example, FIG. 14 illustrates a perspective view of the first protrusions 120 according to some embodiments of the present disclosure. In some embodiments, the position of the first protrusions 120 in, for example, FIG. 1, 5, or 8A to 8C may be projected onto the sensor layer 100. In some embodiments, after projecting the position of the first protrusions 120 onto the sensor layer 100, the pitch $P_x$ of two adjacent first protrusions 120 in the first direction X is equal to the pitch $P_y$ of two adjacent first protrusions 120 in the second direction Y.

Figure 15:
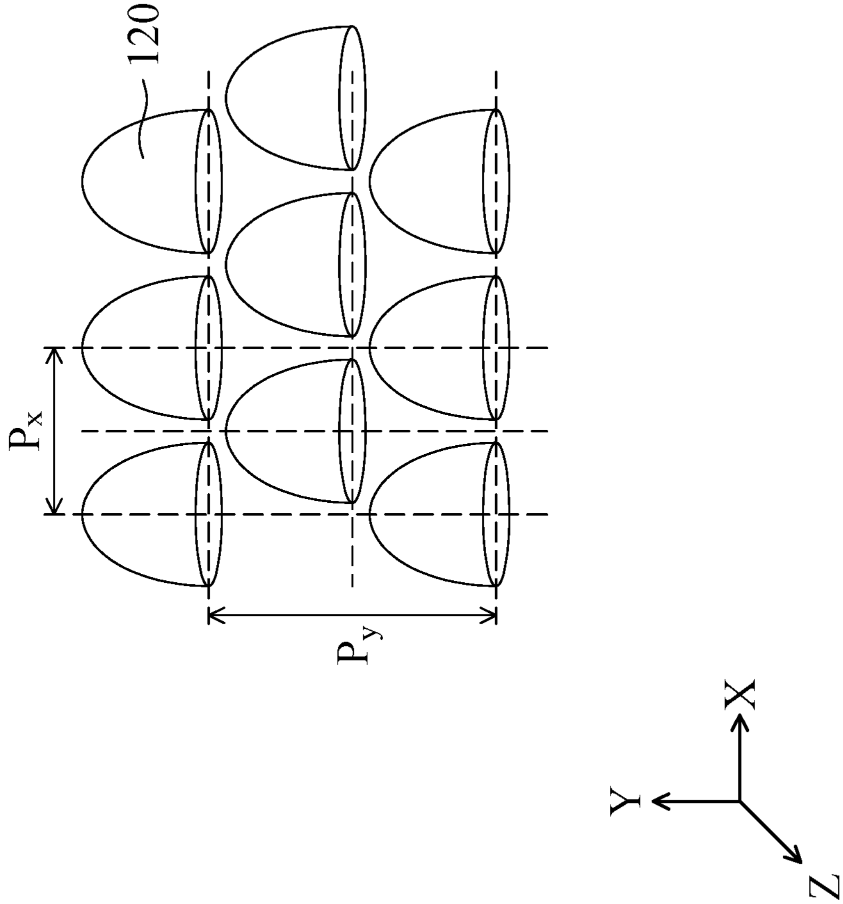

FIG. 15 illustrates a perspective view of the first protrusions 120 according to some embodiments of the present disclosure. In some embodiments, the position of the first protrusions 120 in, for example, FIG. 1, 5, or 8A to 8C may be projected onto the sensor layer 100. In some embodiments, after projecting the position of the first protrusions 120 onto the sensor layer 100, the pitch $P_x$ of two adjacent first protrusions 120 in the first direction X is equal to half of the pitch $P_y$ of two adjacent first protrusions 120 in the second direction Y.

Figure 16:
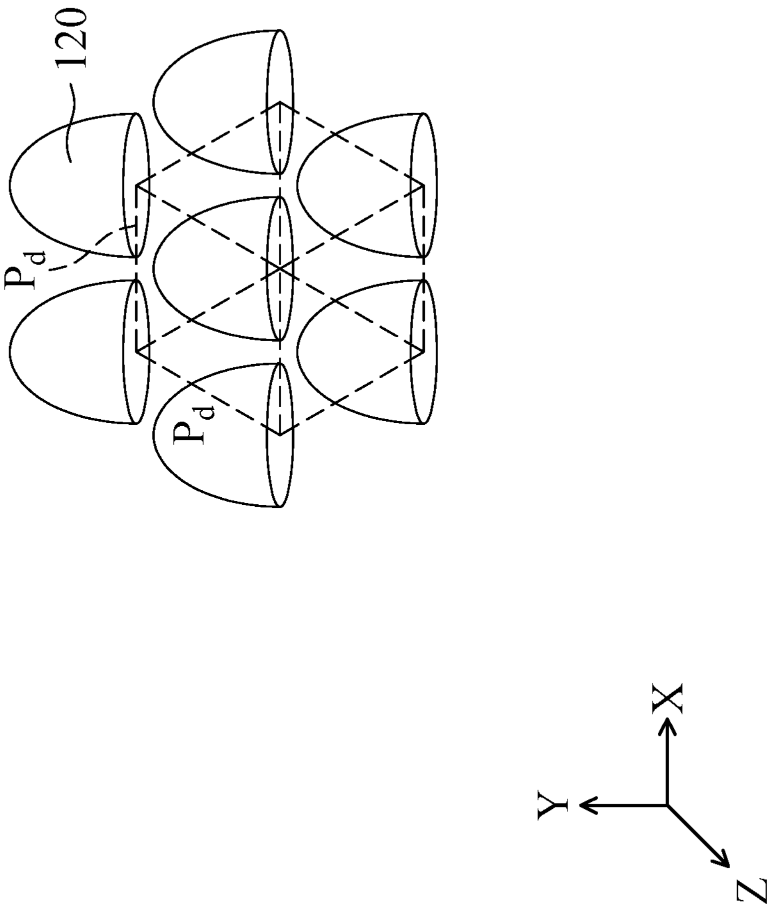

FIG. 16 illustrates a perspective view of the first protrusions 120 according to some embodiments of the present disclosure. In some embodiments, the position of the first protrusions 120 in, for example, FIG. 1, 5, or 8A to 8C may be projected onto the sensor layer 100. In some embodiments, after projecting the position of the first protrusions 120 onto the sensor layer 100, any two of the first protrusions have the same pitch $P_d$.

Figure 17:
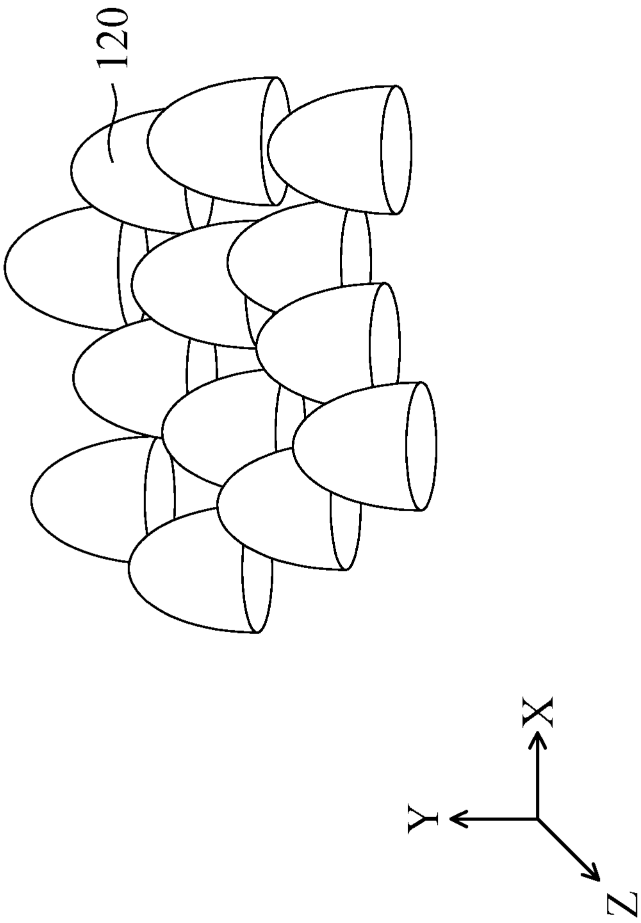

FIG. 17 illustrates a perspective view of the first protrusions 120 according to some embodiments of the present disclosure. In some embodiments, the position of the first protrusions 120 in, for example, FIG. 1, 5, or 8A to 8C may be projected onto the sensor layer 100. In some embodiments, after projecting the position of the first protrusions 120 onto the sensor layer 100, the first protrusions are randomly arranged.

Figure 18:
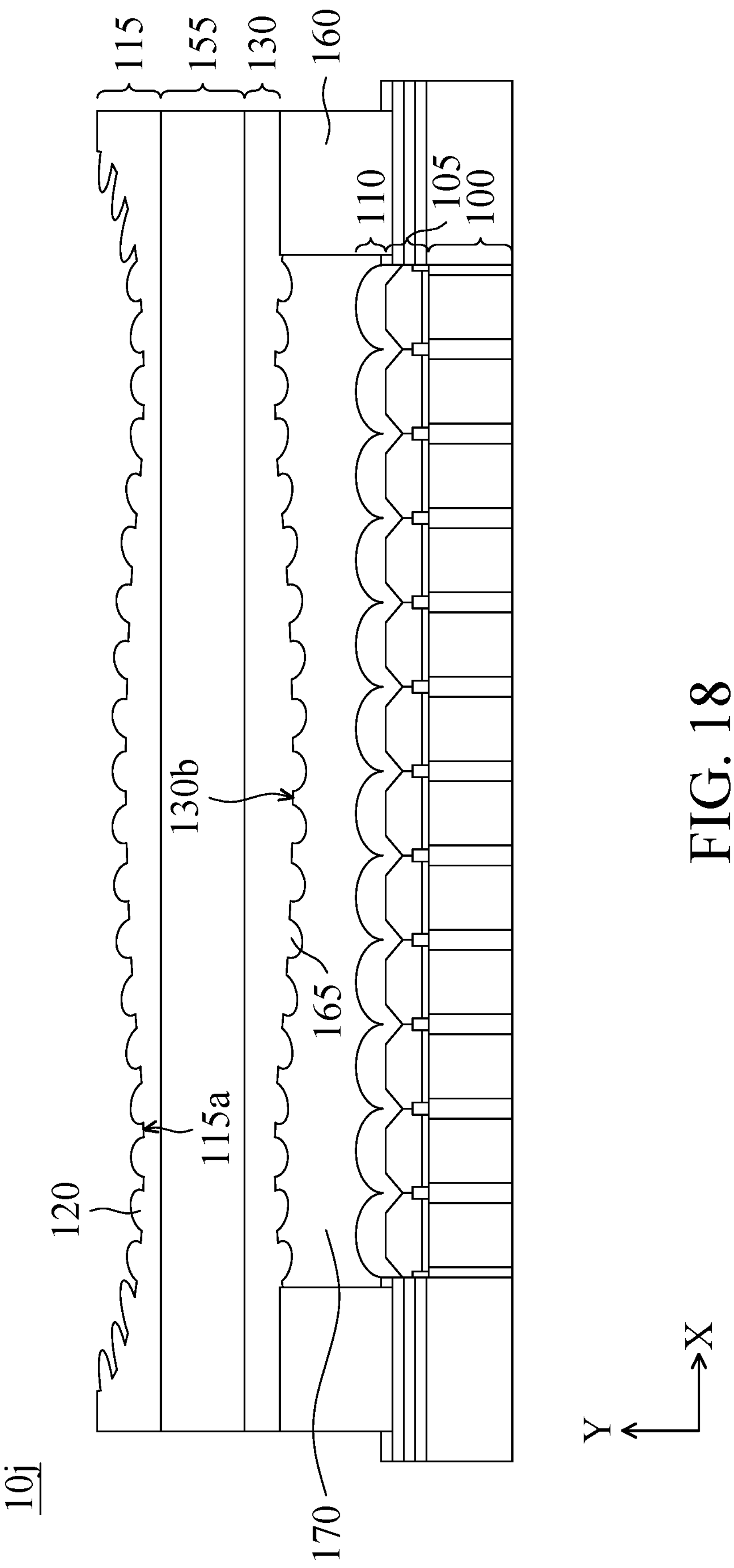
FIG. 18 illustrates a cross-sectional view of the image sensor according to other embodiments of the present disclosure.

FIG. 18 illustrates a cross-sectional view of the image sensor 10*j* according to other embodiments of the present disclosure. In some embodiments, the first surface 115*a* of the first cut filter layer 115 is a free-form surface. In some embodiments, the image sensor 10*j* further includes a second cut filter layer 130, a glass substrate 155, and a supporting structure 160. In some embodiments, the second cut filter layer 130 is disposed over the lens layer 110 and below the first cut filter layer 115. In some embodiments, a second surface 130*b* of the second cut filter layer 130 has a plurality of second protrusions 165. In some embodiments, the glass substrate 155 is disposed between the first cut filter layer 115 and the second cut filter layer 130 and securing the first cut filter layer 115 and the second cut filter layer 130. In some embodiments, the supporting structure 160 separates the lens layer 110 from the first cut filter layer 115, the glass substrate 155, and the second cut filter layer 130, such that the second cut filter layer 130 is separated from the lens layer 110 by air 170. In other words, the layer with low refractive index is replaced by air 170.

In summary, the embodiment of the present disclosure provides a cut filter layer with a plurality of protrusions, which may effectively improve the problem of flare rays and enhance the capability of selection of the cut filter layer. In other words, the cut filter layer of the present embodiment may block (or reflect) the light of the specific wavelength more effectively and reduce the percentage of light of the selected wavelength to be blocked (or reflected), which effectively improves the performance of the image sensor. Thus, the various embodiments described herein offer several advantages over the existing art. It will be understood that not all advantages have been necessarily discussed herein, no particular advantage is required for all embodiments, and other embodiments may offer different advantages.

The scope of the present disclosure is not limited to the technical solutions consisting of specific combinations of the technical features described above, but should also cover other technical solutions consisting of any combinations of the technical features described above or their equivalent features, all of which are within the scope of the protection of the present disclosure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure. Therefore, the scope of protection should be determined through the claims. In addition, although some embodiments of the present disclosure are disclosed above, they are not intended to limit the scope of the present disclosure.

Reference throughout this specification to features, advantages, or similar language does not imply that all of the features and advantages that may be realized with the present disclosure should be or are in any single embodiment of the disclosure. Rather, language referring to the features and advantages is understood to mean that a specific feature, advantage, or characteristic described in connection with an embodiment is included in at least one embodiment of the present disclosure. Thus, discussions of the features and advantages, and similar language, throughout this specification may, but do not necessarily, refer to the same embodiment.

Furthermore, the described features, advantages, and characteristics of the disclosure may be combined in any suitable manner in one or more embodiments. One skilled in the prior art will recognize, in light of the description herein, that the disclosure can be practiced without one or more of the specific features or advantages of a particular embodiment. In other instances, additional features and advantages may be recognized in certain embodiments that may not be present in all embodiments of the disclosure.

What is claimed is:

1. An image sensor, comprising:

a sensor layer;

a color filter layer disposed on the sensor layer;

a lens layer disposed on the color filter layer, wherein the lens layer comprises a plurality of micro lenses; and a first cut filter layer disposed over the lens layer, wherein a first surface of the first cut filter layer has a plurality of first protrusions, wherein a pitch of two adjacent ones in the first protrusions is less than about 700 nm, and wherein each of the first protrusions has a flat upper surface, and a diameter a of the flat upper surface is less than a diameter b of a bottom surface of each of the first protrusions, wherein a curved surface connecting the flat upper surface and the bottom surface of each of the first protrusions in a cross-section of a first direction and a second direction satisfies the following equation (2):

$$y = q(x-k)^2 + h \quad (2)$$

wherein x is the coordinate of each of the first protrusions in the first direction, y is the coordinate of each of the first protrusions in the second direction, k is the coordinate of a tipping point of each of the first protrusions in the first direction, q is a constant less than 0, h is a vertical distance between the flat upper surface and the bottom surface of each of the first protrusions, and the first direction is perpendicular to the second direction, and wherein each of the first protrusions has a sub-protrusion on the flat upper surface, and wherein the sub-protrusion is a conical structure, and wherein a diameter c of a bottom surface of the sub-protrusion satisfies c<a<b, and wherein a height $h_c$ of the sub- protrusion satisfies $h>h_c$.

2. The image sensor as claimed in claim 1, wherein each of the first protrusions in a cross-section of a first direction and a second direction satisfies the following equation (1):

$$(x-k)^2 = q(y-200r) \quad (1)$$

wherein x is the coordinate of each of the first protrusions in the first direction, y is the coordinate of each of the first protrusions in the second direction, k is the coordinate of a tipping point of each of the first protrusions in the first direction, q is a constant less than 0, r is a constant greater than 1, and the first direction is perpendicular to the second direction.

3. The image sensor as claimed in claim 2, wherein a height h of each of the first protrusions satisfies the equation h=200r.

4. The image sensor as claimed in claim 1, wherein the first surface of the first cut filter layer is a concave surface, a convex surface, a conical surface, or a free-form surface.

5. The image sensor as claimed in claim 4, comprising:

a second cut filter layer disposed between the first cut filter layer and the lens layer, wherein a refractive index of the lens layer is greater than a refractive index of the second cut filter layer, and wherein a refractive index of the first cut filter layer is greater than the refractive index of the second cut filter layer, and wherein an upper surface of the second cut filter layer has a plurality of second protrusions.

6. The image sensor as claimed in claim 4, wherein the first surface of the first cut filter layer in a cross-section of a first direction and a second direction satisfies the following equation (3):

$$x = \frac{c \cdot y^2}{1+\sqrt{1-(1+k)c^2y^2}} + a \cdot y^2 + b \cdot y^4 + d \cdot y^6 + e \cdot y^8 + f \cdot y^{10} + g \cdot y^{12} \quad (3)$$

wherein x is the coordinate of each of the first protrusions in the first direction, y is the coordinate of each of the first protrusions in the second direction, k is conical constant, c is curvature, a, b, d, e, f, g are constants, and the first direction is perpendicular to the second direction.

7. The image sensor as claimed in claim 4, further comprising:

a second cut filter layer disposed on the lens layer, wherein a refractive index of the lens layer is greater than a refractive index of the second cut filter layer, wherein the second cut filter layer has a flat upper surface; and an optical layer disposed on the second cut filter layer and in direct contact with the first cut filter layer, wherein the second cut filter layer and the optical layer are disposed between the first cut filter layer and the lens layer.

8. The image sensor as claimed in claim 4, further comprising:

a glue layer disposed on the lens layer; and a substrate secured over the lens layer by the glue layer and in direct contact with the first cut filter layer, wherein the glue layer and the substrate are disposed between the first cut filter layer and the lens layer.

9. The image sensor as claimed in claim 4, further comprising:

a second cut filter layer disposed on the lens layer, wherein a refractive index of the lens layer is greater than a refractive index of the second cut filter layer, wherein the second cut filter layer has a flat upper surface;

a glue layer disposed on the second cut filter layer; and a substrate secured over the second cut filter layer by the glue layer and in direct contact with the first cut filter layer, wherein the second cut filter layer, the glue layer, and the substrate are disposed between the first cut filter layer and the lens layer.

10. The image sensor as claimed in claim 4, further comprising:

a second cut filter layer disposed on the lens layer, wherein a refractive index of the lens layer is greater than a refractive index of the second cut filter layer, wherein the second cut filter layer has a flat upper surface;

an optical layer disposed on the second cut filter layer;

a glue layer disposed on the optical layer; and a substrate secured over the optical layer by the glue layer and in direct contact with the first cut filter layer, wherein the second cut filter layer, the optical layer, the glue layer, and the substrate are disposed between the first cut filter layer and the lens layer.

11. The image sensor as claimed in claim 1, wherein after projecting a position of the first protrusions onto the sensor layer, a pitch of two adjacent ones of the first protrusions in a first direction is equal to a pitch of two adjacent ones of the first protrusions in a second direction.

12. The image sensor as claimed in claim 1, wherein after projecting a position of the first protrusions onto the sensor layer, a pitch of two adjacent ones of the first protrusions in a first direction is equal to half of a pitch of two adjacent ones of the first protrusions in a second direction.

13. The image sensor as claimed in claim 1, wherein after projecting a position of the first protrusions onto the sensor layer, any two of the first protrusions have a same pitch.

14. The image sensor as claimed in claim 1, wherein after projecting a position of the first protrusions onto the sensor layer, the first protrusions are randomly arranged.

15. The image sensor as claimed in claim 1, wherein a material of the first protrusions of the first cut filter layer comprises ZrO2, TiO2, Si3N4, SiO2, indium tin oxide (ITO), Si, amorphous silicon, polycrystalline silicon, group III-V semiconductor compounds, or a combination thereof, or wherein a material of the first protrusions of the first cut filter layer comprises photoresist, acrylic, plastic, glass, glue, polydimethylsiloxane (PDMS), light-curing materials, heat-curing materials, or a combination thereof.

16. The image sensor as claimed in claim 1, wherein the first protrusions are formed by a nanoimprinting process, a photolithography process, a material reflow process, a molding process, a laser engraving process, an electron beam engraving process, or a combination thereof, or wherein the first protrusions are formed by light-curing, heat-curing, stress curing, electric curing, or a combination thereof.

17. The image sensor as claimed in claim 1, further comprising:

a second cut filter layer disposed over the lens layer and below the first cut filter layer, wherein a second surface of the second cut filter layer has a plurality of second protrusions;

a glass substrate disposed between the first cut filter layer and the second cut filter layer and securing the first cut filter layer and the second cut filter layer; and a supporting structure separating the lens layer from the first cut filter layer, the glass substrate, and the second cut filter layer, such that the second cut filter layer is separated from the lens layer by air.

* * * * *